(12) United States Patent
Choi

(10) Patent No.: US 6,653,056 B2
(45) Date of Patent: Nov. 25, 2003

(54) PROCESS FOR PATTERNING NON-PHOTOIMAGABLE CERAMIC TAPE

(75) Inventor: John Haetak Choi, Wilmington, DE (US)

(73) Assignee: E. I. du Pont Nemours and Company, Wilmington, DE (US)

( * ) Notice: Subject to any disclaimer, the term of this patent is extended or adjusted under 35 U.S.C. 154(b) by 103 days.

(21) Appl. No.: 09/901,246

(22) Filed: Jul. 9, 2001

(65) Prior Publication Data

US 2002/0028410 A1 Mar. 7, 2002

Related U.S. Application Data

(63) Continuation-in-part of application No. 09/614,916, filed on Jul. 12, 2000, now abandoned.

(51) Int. Cl.[7] .................................................. G03F 7/26
(52) U.S. Cl. ........................................ 430/313; 430/320
(58) Field of Search ................................ 430/311, 313, 430/322, 323, 317, 320

(56) References Cited

U.S. PATENT DOCUMENTS

| 3,060,023 A | 10/1962 | Burg et al. |
| 3,649,268 A | 3/1972 | Chu et al. |
| 3,833,384 A | 9/1974 | Noonan et al. |
| 3,984,244 A | 10/1976 | Collier et al. |
| 4,193,797 A | 3/1980 | Cohen et al. |
| 4,273,857 A | 6/1981 | Leberzammer et al. |
| 4,415,651 A | 11/1983 | Proskow |
| 4,415,652 A | 11/1983 | Proskow |
| 4,496,509 A | 1/1985 | Kita et al. .................. 264/175 |
| 4,510,230 A | 4/1985 | Coveleskie et al. |
| 4,987,054 A | 1/1991 | Sondergeld et al. |
| 5,045,437 A | 9/1991 | Bast .......................... 430/320 |

FOREIGN PATENT DOCUMENTS

| GB | 1 391 298 | 4/1975 |
| JP | 59-39761 | 3/1984 |
| JP | 59-121152 | 7/1984 |
| JP | 61-163163 | 7/1986 |
| JP | 61-261255 | 11/1986 |
| JP | 03-228865 | 10/1991 |
| WO | WO 00/31591 | 6/2000 |

*Primary Examiner*—Kathleen Duda

(57) ABSTRACT

The invention is directed to a process for patterning ceramic tape wherein a photoresist is applied to a ceramic tape, which enables the photoresist, after being exposed patternwise, and developed, to act as a development mask for the tape. The tape then undergoes a development stage, which ultimately removes undesired sections of tape. The tape contains polymeric binder(s) with acidic or alkaline functional pendant groups but not photosensitive ingredients. Therefore, the tape is aqueous processable but itself cannot be photoimaged. However, when this tape is used with conventional photoresists that have the development chemistry opposite from that of the tape, it allows the photoresist to be used as a development barrier layer for the tape.

6 Claims, 2 Drawing Sheets

PROCESS FOR PATTERNING NON-PHOTOIMAGABLE CERAMIC TAPE

FIELD OF THE INVENTION

The invention is directed to a process for patterning non-photoimagable ceramic tape utilizing photoresist technology wherein the photoresist, after imagewise exposure and development, acts as a development mask for the ceramic tape.

BACKGROUND OF THE INVENTION

Ceramic green tapes have long been used as dielectric substrates in hybrid circuit fabrication and are now being used in an emerging technology of flat panel display development. Forming via holes or barrier rib patterns on the tape is currently done by mechanical processes such as die punching or sandblasting. However, as the industry trend moves toward finer feature sizes and more complicated patterns, mechanical patterning processes fall short in meeting this trend.

Photoimaging can satisfy such requirements on resolution and pattern complexity. However, the conventional photoimagable ceramic tape has two major drawbacks: (1) physical hardening of the tape as a result of photocrosslinking or polymerization tends to make the tape brittle and therefore difficult to handle, and (2) reflective scattering of light by material interfaces causing partial crosslinking of tape under dark silver halide patterned areas like via holes which reduces space resolution.

The object of this invention is to solve the above-noted problems by providing a new method of patterning a ceramic green tape without the ceramic tape itself containing photoimagable components.

SUMMARY OF THE INVENTION

The invention is directed to method for patterning non-photoimagable ceramic tape comprising the steps of:
  (a) applying to a non-photoimagable ceramic tape that contains at least one polymeric binder containing acid functional pendant groups at least one photoresist comprising a photosensitive layer and at least one polymeric binder containing alkaline functional pendant groups;
  (b) exposing the photoresist wherein exposed sections of the photoresist become hardened;
  (c) removing sections of the photoresist that were not hardened with a first developer containing an acidic developing solution revealing sections of the ceramic tape; and
  (d) removing the revealed sections of ceramic tape with a second developer containing an alkaline developing solution.

The invention is further directed to a process with chemistries opposite of that given above.

DETAILED DESCRIPTION OF THE INVENTION

Figure 1A:
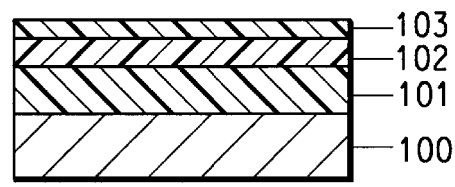
FIG. 1 is a schematic depicting the formation of a patterned ceramic tape on substrate.

In the present invention, a photoresist is applied to a tape, which enables the photoresist, after being exposed patternwise, and developed, to act as a development mask for the tape. The tape then undergoes a development stage, which ultimately removes undesired sections of tape.

The tape used in the process of the present invention contains polymeric binders with acidic or alkaline functional pendant groups but not photosensitive ingredients. Therefore, the tape is aqueous processable but itself cannot be photoimaged. However, when this tape is used with conventional photoresists that have the development chemistry opposite from that of the tape; it allows the photoresist to be used as a development barrier layer for the tape. For example, pairing the photoresist with a tape allows for two combinations of chemistry: (1) acid developable tape with alkaline developable resist and (2) alkaline developable tape with acid-developable resist. A photoresist or tape containing acidic polymers would have alkaline developability and a photoresist or tape containing basic or alkaline polymers would have acidic developability. In either case (1) or (2), the process follows the same main pattern as shown below:

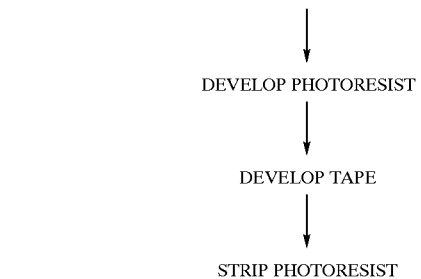

Ceramic tapes utilized in the invention are not photosensitive. They may be dielectric or conductive depending on the intended application. The tape is chosen by its polymer binder content. Typically, tapes with polymer binders of acid functionality are commercially available by such names as CARBOSETS® (B. F. Goodrich) or ELVACITES® (Imperial Chemicals Inc.). They contain, for example, copolymers of methylmethacrylate (MMA), ethylacrylate (EA), or butylacrylate (BA) with additions of methacrylic (MAA) or acrylic acid (AA) wherein the acid content of the polymer is 10–30 mole %. Such materials are described in Burg U.S. Pat. No. 3,060,023; Chu U.S. Pat. No. 3,649,268; and Collier U.S. Pat. No. 3,984,244 which are incorporated herein by this reference. The molecular weight of the copolymers is typically in the range of 10,000 to 500,000. The preferred binder is a copolymer of methylmethacrylate, ethylacrylate, and acrylic acid with 20–30 mole % acid content.

Binders with alkaline functional groups are not as common as acidic ones but are commercially available. A preferred binder system is the copolymerization of methylmethacrylate (MMA) with dimethylaminoethylmethacrylate (DMAEMA), which structure is shown in the Glossary. The most preferred binder contains MMA and DMAEMA in a 73/27 ratio.

The choice of the polymer contained in the tape allows for the removal of the undesired section of ceramic tape in the method of the invention, that is, a photoresist having acidic polymer groups will be laminated to a ceramic tape with basic polymer groups. The photoresist is then patternwise exposed to actinic radiation and developed using alkaline chemistry to remove the unexposed areas. This removal of the photoresist reveals sections of the ceramic tape underneath. Subsequent development with acidic chemistry removes the revealed area of tape; leaving the remaining tape sections covered by the remaining photoresist.

In another embodiment, a ceramic tape containing polymers with acid functional pendant groups is paired with a photoresist having polymers with basic functionality. The process scheme is the same as above but the development chemistry is reversed. Ceramic tapes are described more fully hereinbelow.

The invention utilizes ceramic tapes filled with inorganic solid material which may include ceramic, metal, metal alloy, metal oxide or mixtures thereof; and dielectric tapes using solids, for example, such as alumina, titanates, zirconates and stannates; and precursors of such materials, i.e., solid materials which upon firing are converted to dielectric solids, and to mixtures of any of these. Additional examples of dielectric solids that may be used are $BaTiO_3$, $CaTiO_3$, $SrTiO_3$, $PbTiO_3$, $CaZrO_3$, $BaZrO_3$, $CaSnO_3$, $BaSnO_3$, and $Al_2O_3$. As will be apparent to those skilled in the ceramic arts, the exact chemical composition of the ceramic solids to be used in the composition of a tape is not ordinarily critical in the rheological sense. Examples of suitable conductive inorganic solids may include for example silver, gold, copper, platinum and alloys, oxides and mixtures thereof and lead ruthenate pyrochlore.

The inorganic solids usually do not exceed 20 $\mu$m and, furthermore, at least 75 wt. % of the inorganic solids have a size of 1–10 $\mu$m. The dispersion is used to make dry film, so the maximum particle size must not exceed the thickness of the film. It is preferred that at least 90 wt. % of the inorganic solids fall within the 1–10 $\mu$m range.

Glass frit is used as an inorganic binder that softens at a firing stage in the manufacturing process. It encapsulates other inorganic particles and aids in sintering the inorganic crystalline particulates. The glass frit may be any well-known composition that has a melting temperature below that of the inorganic solids. Nevertheless, in dielectric applications, it is preferred that the glass transition temperature (Tg) of the inorganic binder be 550–825° C. The glass frits most preferably used are the borosilicate frits, such as lead borosilicate frit, bismuth, cadmium, barium, calcium, or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compound that will yield the desired oxides under the usual conditions of frit production. For example, boric oxide will be obtained from boric acid, silicon dioxide will be produced from flint, barium oxide will be produced from barium carbonate, etc. The glass is preferably milled in a ball mill with water to reduce the particle size of the frit and to obtain a frit of substantially uniform size. It is then settled in water to separate fines, and supernatant fluid containing the fines is removed. Other methods of classification may be used as well.

Fillers such as $\alpha$ quartz, $CaZrO_3$, forslerit, mullite, cordierite, forsterite, zircon, zirconia, $ZrO_2$, $TiO_2$, $CaTiO_3$, $MgTiO_3$, $SiO_2$, amorphous silica, $Al_2O_3$, or millite may be used by themselves or in mixtures to adjust the temperature coefficient of expansion (TCE).

The organic medium in which the glass and inorganic solids are dispersed is comprised of the polymeric binder which is dissolved in a volatile organic solvent and, optionally, other dissolved materials such as plasticizers, release agents, dispersing agents, stripping agents, antifouling agents, and wetting agents. The polymeric binder may be one polymer or a combination of polymers but at least one polymer needs to contain a content of either an acid or alkaline functional pendent group depending on the application of the present invention.

Various polymeric materials have been employed as the binder for green (unfired) tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly (methyl siloxane), poly(methylphenyl siloxane), polystyrene, butadiene/styrene copolymer, polystyrene, poly (vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly (lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

Frequently, the polymeric binder will also contain a small amount, relative to the binder polymer, of a plasticizer that serves to lower the glass transition temperature (Tg) of the binder polymer. The choice of plasticizers is, of course, determined primarily by the polymer that must be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations.

The solvent component of the casting solution is chosen so as to obtain complete solution of the polymer and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1,3-monoisobutyrate, toluene, methylene chloride and fluorocarbons. It will be recognized that individual components of the solvent may not be complete solvents for the binder polymer. Yet, when blended with other solvent components, they function as solvents.

A green tape is formed by casting a thin layer of a dispersion of the glass filler, polymeric binder and solvent as described above onto a flexible substrate, heating the cast layer to remove the volatile solvent and then separating the solvent-free layer from the substrate.

Conventional photoresists as used throughout the industry are utilized in this invention. More specifically, descriptions of photoresists may be found in DE 2,320,849 (Kodak); GB 1,391,298 (Dynachem) and U.S. Pat. No. 4,273,857; U.S. Pat. No. 4,987,054; and U.S. Pat. No. 4,510,230 (E. I. du Pont de Nemours and Company); U.S. Pat. No. 4,193,797; U.S. Pat. No. 4,415,652; and U.S. Pat. No. 4,415,651 and are incorporated herein by these references.

Generally, dry film photoresists are made up of a multilayer composite which comprises: a base film, generally polyester, such as polyethylene terephthalate; one or more photosensitive layers; and a coversheet, generally polyolefin, such as polyethylene or polypropylene.

The photosensitive layer(s) typically comprise:

1. A polymer binder which may be one or a combination of polymers, containing functional groups to provide aqueous development and stripping, for example, (1) carboxylic acid groups as in a methyl methacrylate (MMA)/ethyl acrylate (EA)/acrylic acid (AA) terpolymer or a MMA/EA/butyl acrylate/styrene/methacrylic acid pentapolymer which enables the resist to be developed and stripped in aqueous alkali solutions; or (2) basic groups as in a MMA/dimethylaminoethyl acrylate copolymer which enable the resist to be developed and stripped in aqueous acid solutions.

2. A photoinitiator system which produces free radicals on exposure to light, such as combinations of Michler's Ketone (and variants thereof), benzophenone, dimers of triarylimidazoles, benzoin ethers and ketals, substituted acetophenones, etc.

3. Multifunctional acrylic monomers, such as trimethylolpropane triacrylate, trimethylolpropane trimethacrylate, tetraethylene glycol diacrylate, tripropylene glycol dimethacrate, ethoxylated bisphenol A diacrylates and methacrylates, etc.

4. Color forming systems such as 4-methyl-4-trichloromethylcyclohexadiene and leuco dyes such as leuco crystal violet.

5. Stabilizers, dyes, coating aids and other additives in small amounts appropriate to the end-use application.

Organic solvents can be employed as the developer solution, but the developer solution is preferably an aqueous solution. Suitable aqueous developer solutions used in the development of resists or tapes with acid functional pendent groups include aqueous solutions of an alkali metal carbonate, e.g., sodium carbonate; aqueous solutions of an alkali metal hydroxide, e.g., sodium hydroxide; mixtures thereof; aqueous solutions of a lower alcohol, e.g., ethanol, isopropanol, etc., with an alkanolamine, e.g., ethanolamine, propanolamine, 2-di-ethylaminoethanol, etc.; and the like. Suitable developer solutions used for a resist or tape with alkaline functional pendant groups are, for example, aqueous lactic acid preferably 1% lactic acid, and organic acids such as acetic acid. The presence of a surfactant in the developer solution aids clean development of the element. The strength of the developer solution is governed by the particular resist or tape to be developed, temperature and speed that it passes through the development zone. The developer solution can also contain dyes, pigments, and the like. The developer solution is generally sprayed on the article, but the article may be dipped in the solution. The developed image can then be rinsed with distilled water.

The process of the invention may be employed with a freestanding ceramic tape or a tape on substrate. For illustrative purposes, a tape on substrate will be used in the discussion hereinbelow. First, a patterned ceramic tape on substrate process will be discussed with reference to FIG. 1. For purpose of illustration, an embodiment using a ceramic tape with alkaline functional pendant groups will be discussed (FIG. 1(a)). The starting substrate (100) can involve for illustrative purposes an aluminum nitride substrate, or a sodalime glass substrate as used in plasma display panels.

First a ceramic tape (101) is laminated on a substrate. A conventional dry-film hot-roll laminator such as hrl 24 can be used. Recommended roll temperature and pressure are 80–110 c and 0–40 psi. After removing the polyester base from the tape, a photoresist (102) with coversheet (103) is then laminated thereon. The same laminator and condition can be used in this step. Again, the choice of the photoresist depends on the ceramic tape chosen. For illustrative purposes, since the ceramic tape with polymer containing alkaline functional pendant groups was laminated to the substrate then a photoresist containing a polymer with acid functional pendant groups would be laminated onto the ceramic tape.

Figure 1B:
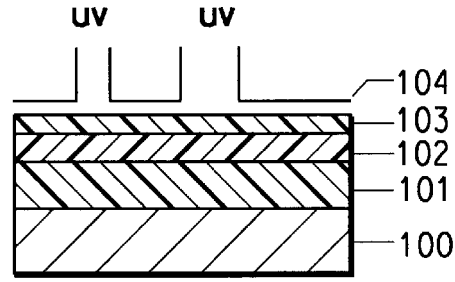

FIG. 1(b) depicts a phototool (104) disposed atop the coversheet (103) of the photoresist (102). A phototool may be, for example, a conventional silver halide image on a polyester sheet or chrome-etched image on a glass substrate. In this application, the image of the phototool is negative to the pattern to be created on the substrate. The photoresist is typically imaged with actinic radiation of 350–400 nm UV. Such radiation can be achieved by common UV light sources used in the imaging industry, most of which are high pressure Hg or Hg—Xe lamps. Imaged (exposed by UV) areas of the photoresist become hardened.

Figure 1C:
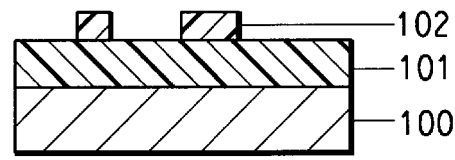

FIG. 1(c). The coversheet is removed and the photoresist is developed using an alkaline developer solution. A conventional alkaline developer normally consists of developing and rinsing chambers and is suitable for this operation. The solution for the developing chamber is about 0.4–1.5 wt. % concentration of $Na_2CO_3$ in water. Tap or distilled water may be used for the rinsing chamber. Recommended development solution temperature is about 80–110° F. and the nozzle spray pressure is about 20–30 psi. Non-hardened sections of the photoresist are removed during the development step exposing areas of the ceramic tape (101).

Figure 1D:
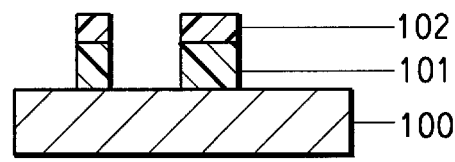

FIG. 1(d). The resist-developed tape is then subjected to another developer, which is the same type used in the step above but contains acid developer solution in the developer chamber. For example, adequate solution is 0.5–1.5 wt. % lactic or acetic acid in water at 80–110° F. range. This solution removes exposed areas of the ceramic tape.

Figure 1E:
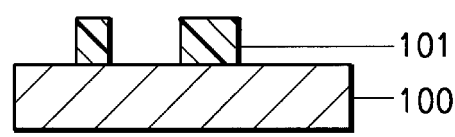

FIG. 1(e). Any remaining photoresist is stripped with an alkaline solution with a higher pH value than what was used in the first (as shown in FIG. 1(c)) development step of the photoresist. A suitable stripping solution is about 1–3 wt. % of NaOH or KOH in water at about 120–150° F. The surface is rinsed with water and dried. In an alternative method for removing remaining photoresist, the photoresist may be burned off in a firing step if the firing temperature and duration are sufficient. Complete organic burn out normally requires 30 mins or longer at temperature of 500° C. or above. A programmable belt driven furnace is recommended for this step.

In another embodiment, the method as described in FIG. 1 could be used with a ceramic tape with acid functional pendant groups. The photoresist chosen for use in this embodiment contain a polymer with alkaline functional pendant groups. The process is similar to that explained hereinabove with the exception of using an acidic development solution for photoresist development and an alkaline development solution for the ceramic tape.

In yet another embodiment, a freestanding tape process is discussed with reference to FIG. 2. For illustrative purposes, a ceramic tape with polymer containing alkaline functional pendant groups will be discussed. The same equipment and conditions used in the example above for the tape on a substrate can be used in the process described for the free standing tape below.

Figure 2A:
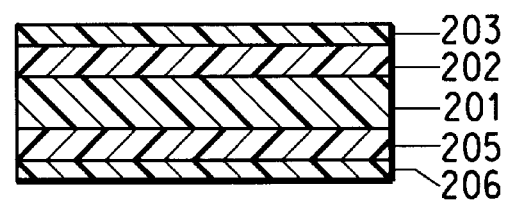
FIG. 2 is a schematic depicting the formation of a patterned freestanding ceramic tape.

FIG. 2(a). A ceramic tape (201) is laminated on top and bottom with photoresists ((202) and (205)) having polymer (s) containing acid functional pendant groups. The photoresists have coversheets (203) and (206).

Figure 2B:
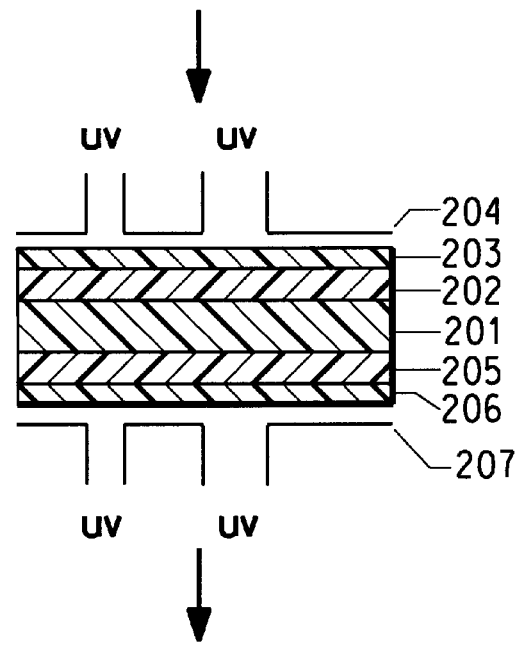

FIG. 2(b) depicts phototools (204) and (207) disposed atop the coversheets (203) and (206). The photoresist (202) and (205) is then imaged through the phototool with actinic radiation or ultra-violet light hardening exposed areas of the photoresists.

Figure 2C:
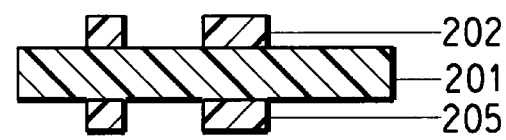

FIG. 2(c). The coversheets are removed and the photoresists are developed using alkaline developer solution. Non-hardened areas of the photoresists are removed during the development step exposing areas of the ceramic tape.

Figure 2D:
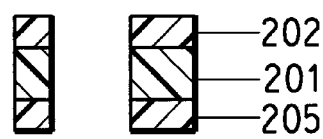

FIG. 2(d). The surface is then subjected to an acid developer solution that removes exposed areas of the ceramic tape creating a pattern. The surfaces are then rinsed with water.

Figure 2E:

FIG. 2(e). Any remaining photoresist is then stripped with an alkaline developer solution. The surfaces are rinsed and dried. In an alternative method for removing the photoresist, remaining photoresist may be burned off during a firing process if the application deems it. Another embodiment of FIG. 2 utilizes tapes and photoresists and developer solutions with chemistries opposite of that found hereinabove.

The present invention will be described in further detail by giving practical examples. The scope of the invention, however, is not limited in any way by these practical examples.

EXAMPLES

Some specific examples of slip compositions for ceramic tapes and photoresists that may be utilized in this invention are given on Examples 1–3. All amounts are given in weight percent based on total composition.

EXAMPLE 1

Formulation for ceramic tape with polymer containing alkaline functional pendent groups:

| Ingredient | Wt. % |
| --- | --- |
| Polymer | 8.74 |
| CYASORB ® UV24 | 1.35 |
| BENZOFLEX ® | 2.41 |
| Alumina | 38.6 |
| Frit | 48.9 |

EXAMPLE 2

Formulation for ceramic tape with polymer containing acid functional pendent groups:

| Ingredient | Wt. % |
| --- | --- |
| CARBOSET ® XPD 2470 | 6.79 |
| CYASORB ® UV24 | 1.41 |
| BENZOFLEX ® | 3.40 |
| Alumina | 39.0 |
| Frit | 49.4 |

EXAMPLE 3

Photoresist (Acid Developable)

| Ingredient | Wt. % |
| --- | --- |
| Polymer | 61.17 |
| TMPTA | 34.00 |
| o-Cl-HABI | 3.84 |

EXAMPLE 3-continued

Photoresist (Acid Developable)

| Ingredient | Wt. % |
| --- | --- |
| EMK | 0.12 |
| LCV | 0.10 |
| TLA 454 | 0.32 |
| N-Phenylglycine | 0.48 |

A tape is cast from slip (composition), the recipes are given above. The slip is cast into tape by conventional tape casting techniques generally known in the industry. More particularly, the composition is coated upon a support film and the solvent is volatilized by heating, resulting in a dry coating thickness of about 0.0001 inch (0.00025 cm) to about 0.01 inch (0.025 cm) or more. A suitable strippable support which preferably has a high degree of dimensional stability to temperature changes may be chosen from a wide variety of films composed of high polymers, e.g., polyamides, polyolefins, polyesters, vinyl polymers, and cellulose esters and may have a thickness of from 0.0005 inch (0.0013 cm) to 0.008 inch (0.02 cm) or more. A particularly suitable support is transparent MYLAR® film by DuPont having a thickness of about 0.001 inch (0.0025 cm).

When an element contains no removable, protective cover sheet and is to be stored in roll form, the reverse side of the strippable support preferably has applied thereto a thin release layer of a material such as wax or silicone to prevent it from sticking to the photopolymerizable material.

Suitable removable, protective cover sheets when used may be chosen from the sample group of high polymer films described above and may have the same wide range of thicknesses. A cover sheet of 0.001 inch (0.0025 cm) thick MYLAR® is especially suitable. Supports and cover sheets provide good protection to the layer during storage prior to use.

EXAMPLE 4

A ceramic tape with polymer containing acid functional groups as given in Example 2 above was laminated at 110° C., 4 ft/min, 30 PSI with a DuPont HRL laminator on a substrate after removing the polyester base from the tape. A photoresist as given in Example 3 with coversheet was then laminated thereon. The same laminator and conditions were used in this step.

A Ag halide pattern on polyester base phototool was disposed atop the coversheet of the photoresist. The image of the phototool was negative to the pattern to be created on the substrate. The photoresist was imaged with PC 130 light source. Imaged or exposed areas of the photoresist become hardened.

The coversheet was removed and the photoresist was developed using an acid developer solution of 1% lactic acid in water. A Kepro Bench Top Acid Developer was used. Development solution temperature was 30° C. Non-hardened sections of the photoresist are removed during the development step exposing areas of the ceramic tape.

The resist-developed tape was then subjected to an alkaline developer of 1% $Na_2CO_3$ in water at 85° F. A conventional alkaline developer with rinsing chambers was used. This solution removed revealed areas of the ceramic tape.

Any remaining photoresist was stripped with a 3% lactic acid solution at 70° C. The surface was rinsed and dried.

| GLOSSARY | |
|---|---|
| N-phenyl glycine | - $HN(C_6H_4)-CH_2-COOH$, coinitiator |
| BENZOFLEX ® | - BENZOFLEX ® 400 Plasticizer; Polypropylene glycol dibenzoate, $(C_3H_6)_nCl_4H_{10}O_3$; Velsicol Chemical Corporation, 5600 N. River Road, Rosemont, IL 60018 |
| Frit | - Alkaline earth aluminum lead borosilicate glass frit; Ferro frit; Manufacturer-Dupont; Alumina $Al_2O_3$ powder; Manufacturer-DuPont. |
| TMPTA | - trimethylolpropane-triacylate; oligomeric monomer; SARTOMER ™ SR 351; Sartomer Company, Oaklands Corporate Center, 468 Thomas Jones Way, Exton, PA 19341 |
| EMK | - Ethyl Michler's Ketone $(C_2H_5)_2N-C_6H_4-CO-C_6H_4-N(C_2H_5)_2$ |
| Itaconic Acid | - Stabilizer, Aldrich Company |
| CYASORB ® UV24 | 2,2'-dihydroxy-4-methoxybenzophenone; UV absorber by American Cynamid |
| CARBOSET ® XPD 2470 | Copolymer of methylmethacrylate, ethylacrylate, butylacrylate, and methacrylic acid by 42:13:20:25 mole ratio by BF Goodrich Company |
| LCV | - Leuco crystal violet, photochromic dye |
| TLA 454 | - Tris(4-ethylamino-2-methylphenyl)-methane |
| o-Cl-HABI | - o-chloro hexaaryl bisimidazole |
| Polymer | DMAEMA (27%) + MMA (73%); Molecular Weight = 50 k (alkaline polymer). Structures below: |

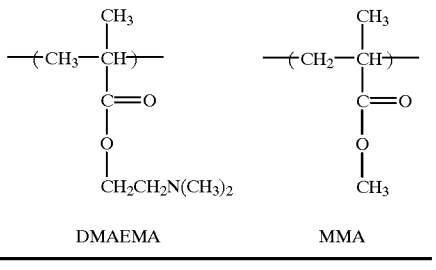

DMAEMA          MMA

What is claimed is:

1. A method for patterning non-photoimagable ceramic tape comprising the steps of:
   (a) applying to a non-photoimagable ceramic tape that contains at least one polymeric binder containing acid functional pendant groups at least one photoresist comprising a photosensitive layer and at least one polymeric binder containing alkaline functional pendant groups;
   (b) exposing the photoresist wherein exposed sections of the photoresist become hardened;
   (c) removing sections of the photoresist that were not hardened with a first developer containing an acidic developing solution revealing sections of the ceramic tape; and
   (d) removing the revealed sections of ceramic tape with a second developer containing an alkaline developing solution.

2. A method for patterning non-photoimagable ceramic tape comprising the steps of:
   (a) applying to a non-photoimagable ceramic tape that contains at least one polymeric binder containing alkaline functional pendant groups at least one photoresist comprising a photosensitive layer and at least one polymeric binder containing acid functional pendant groups;
   (b) exposing the photoresist wherein exposed sections of the photoresist become hardened;
   (c) removing sections of the photoresist that were not hardened with a first developer containing an alkaline developing solution revealing sections of the ceramic tape; and
   (d) removing the revealed sections of ceramic tape with a second developer containing an acid developing solution.

3. The method of claims 1 or 2 wherein the ceramic tape is laminated on a substrate.

4. The method of claims 1 or 2 wherein the photoresist further comprises a base sheet.

5. The method of claims 1 or 2 wherein the photoresist further comprises a coversheet, which is removed during lamination to the ceramic tape.

6. The method of claims 1 or 2 wherein the polymeric binder which contains the functional pendant groups contained in the ceramic tape comprises 10–30 mole % of the polymeric binder found in the tape.

* * * * *